United States Patent
Kosaka et al.

(10) Patent No.: US 10,564,537 B2
(45) Date of Patent: Feb. 18, 2020

(54) PHOTOMASK BLANK, AND PREPARATION METHOD THEREOF

(71) Applicant: Shin-Etsu Chemical Co., Ltd., Tokyo (JP)

(72) Inventors: Takuro Kosaka, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 192 days.

(21) Appl. No.: 15/838,764

(22) Filed: Dec. 12, 2017

(65) Prior Publication Data

US 2018/0180986 A1  Jun. 28, 2018

(30) Foreign Application Priority Data

Dec. 26, 2016  (JP) .................................. 2016-250722

(51) Int. Cl.
| | | |
|---|---|---|
| *G03F 1/32* | (2012.01) | |
| *G03F 1/84* | (2012.01) | |
| *G03F 1/54* | (2012.01) | |
| *G03F 1/26* | (2012.01) | |

(52) U.S. Cl.
CPC .................. *G03F 1/32* (2013.01); *G03F 1/26* (2013.01); *G03F 1/54* (2013.01); *G03F 1/84* (2013.01)

(58) Field of Classification Search
CPC ..... G03F 1/26; G03F 1/32; G03F 1/54; G03F 1/84

USPC ............................................................. 430/5
See application file for complete search history.

(56) References Cited

U.S. PATENT DOCUMENTS

| | | |
|---|---|---|
| 5,830,607 A | 11/1998 | Isao et al. |
| 2001/0037994 A1 | 11/2001 | Ezaki |

FOREIGN PATENT DOCUMENTS

| | | |
|---|---|---|
| EP | 3 079 012 A2 | 10/2016 |
| EP | 3 267 253 A1 | 1/2018 |
| JP | 7-140635 A | 6/1995 |
| JP | 2016-167052 A | 9/2016 |

OTHER PUBLICATIONS

Extended European Search Report dated May 25, 2018, in European Patent Application No. 17207149.0.

*Primary Examiner* — Christopher G Young
(74) *Attorney, Agent, or Firm* — Birch, Stewart, Kolasch & Birch, LLP

(57) ABSTRACT

A photomask blank including a transparent substrate, and at least one film (A) containing chromium and nitrogen and free of silicon and at least one film (B) containing silicon and oxygen, and free of a transition metal that are contacted to each other In the blank, when an intension of secondary ions is measured along a thickness direction of the films by a time-of-flight secondary ion mass spectrometry (TOF-SIMS), an intension of secondary ions derived from $Cr_2O_5$ is lower than an intension of secondary ions derived from SiN, at a position located at the interface or its vicinity of the film (A) and film (B) and having a maximum intensity of secondary ions derived from $SiCrO_5$.

10 Claims, 4 Drawing Sheets

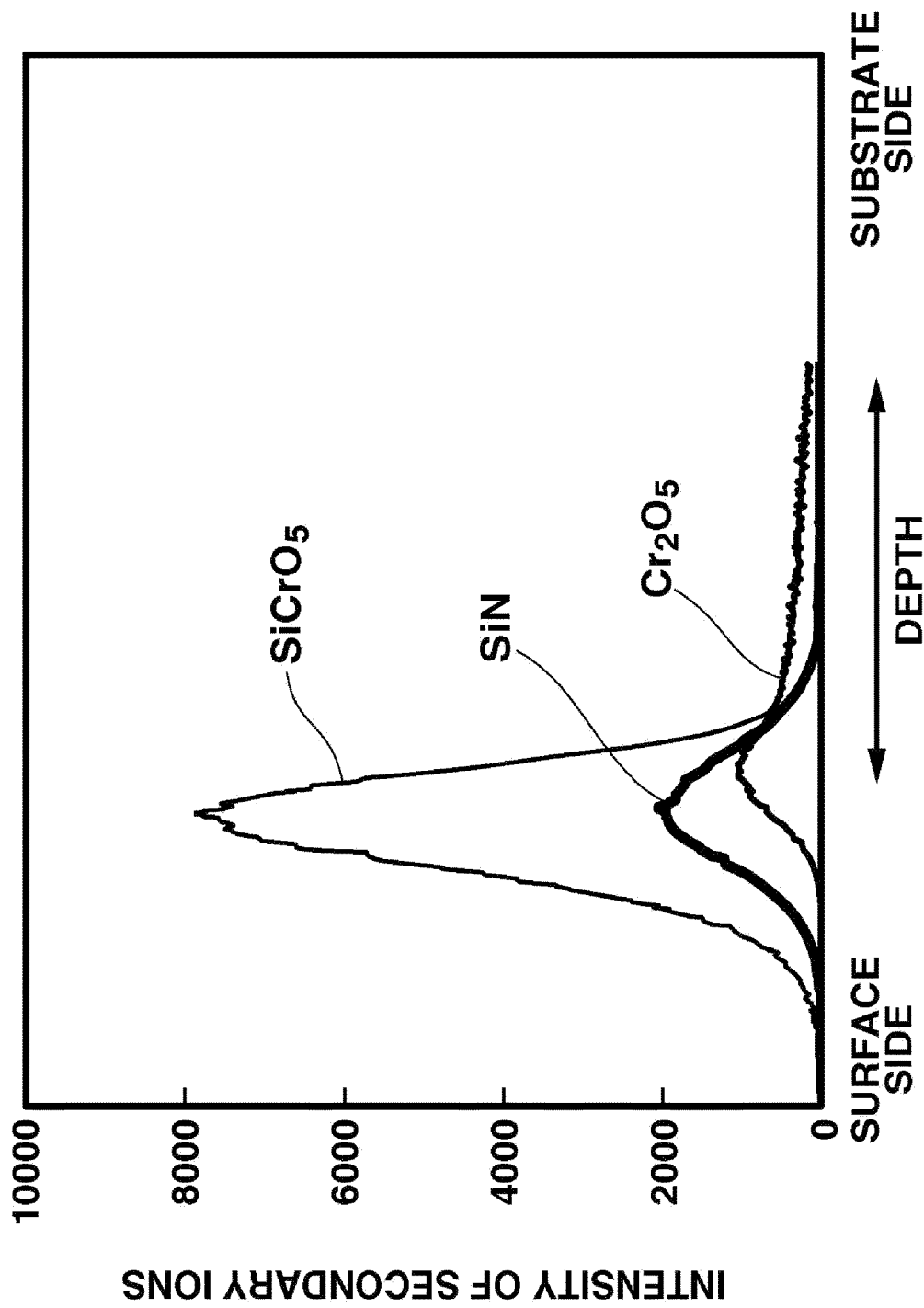

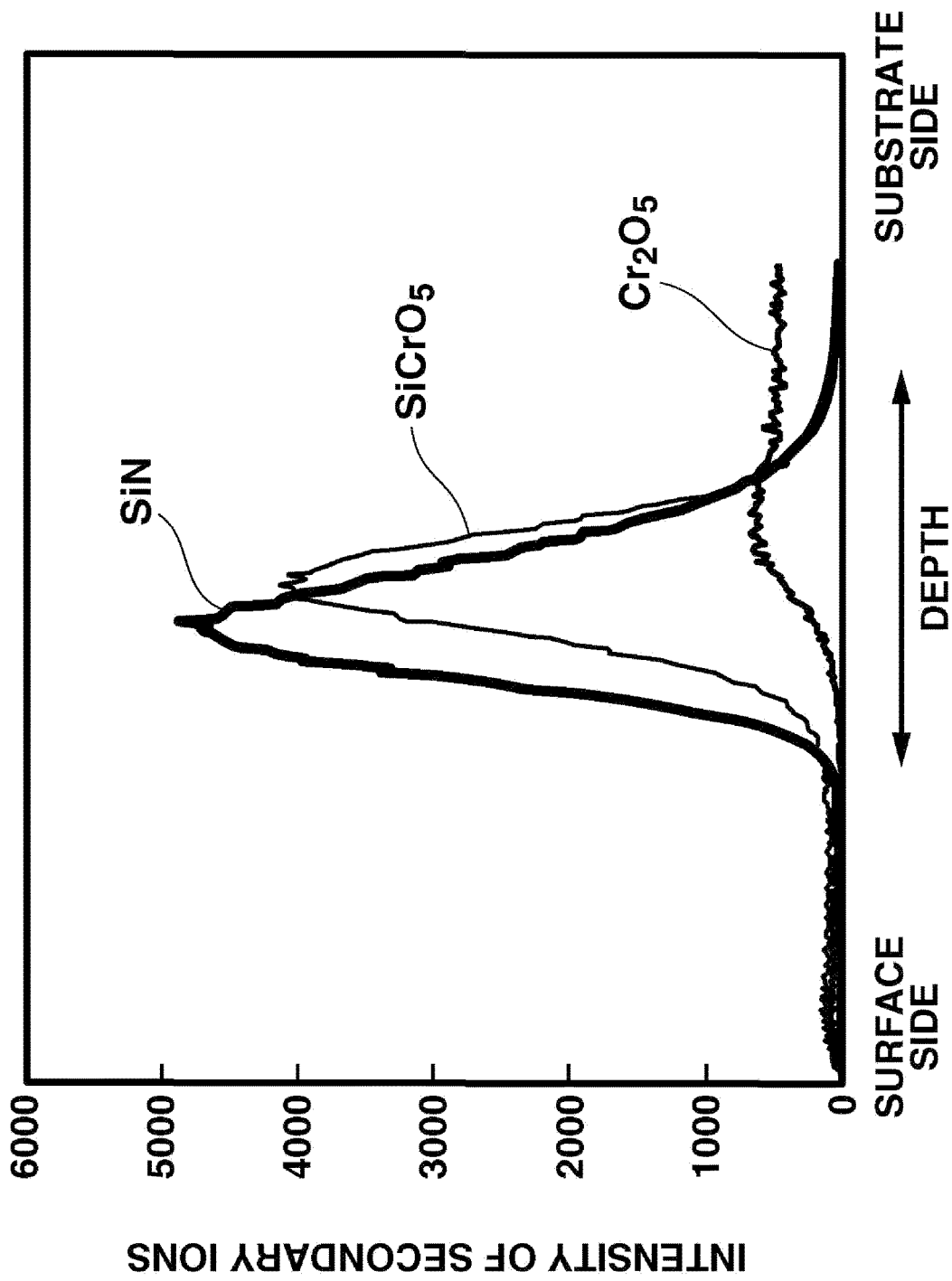

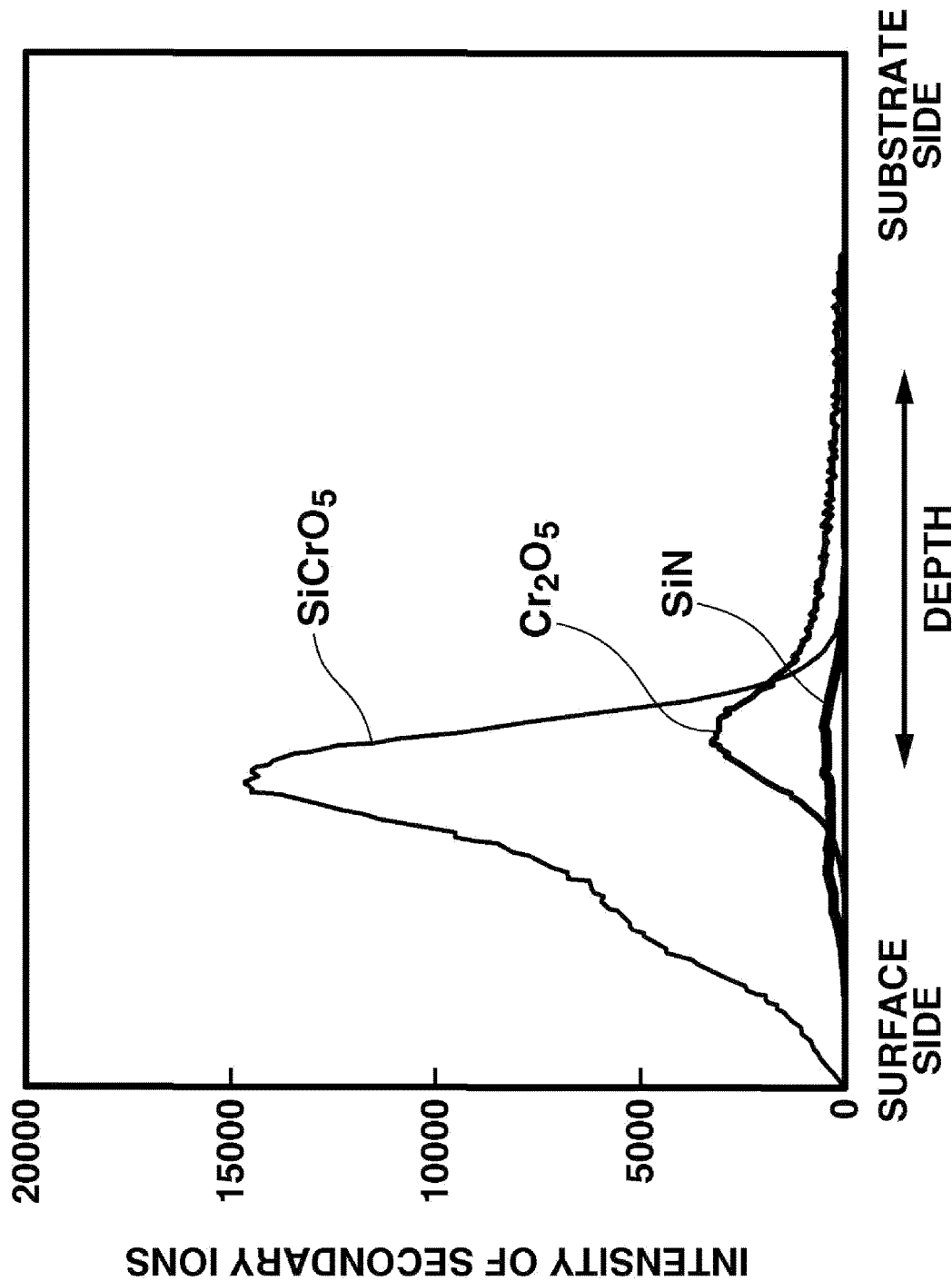

PHOTOMASK BLANK, AND PREPARATION METHOD THEREOF

CROSS-REFERENCE TO RELATED APPLICATION

This non-provisional application claims priority under 35 U.S.C. § 119(a) on Patent Application No. 2016-250722 filed in Japan on Dec. 26, 2016, the entire contents of which are hereby incorporated by reference.

TECHNICAL FIELD

This invention relates to a photomask blank which is processed into a photomask for use in the microfabrication of semiconductor integrated circuits, and a method for preparing the same.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

In some cases, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase shift of approximately 180 degrees on a photomask, such that contrast may be improved by utilizing optical interference. One of the photomasks adapted for the phase shift method is a halftone phase shift type photomask. Typically, the halftone phase shift type photomask includes a substrate of quartz or similar material which is transparent to exposure light, and a photomask pattern of halftone phase shift film formed on the substrate, capable of providing a phase shift of approximately 180 degrees and having an insufficient transmittance to contribute to pattern formation. As the halftone phase shift mask, Patent Document 1 proposes a mask having a halftone phase shift film of molybdenum silicide oxide (MoSiO) or molybdenum silicide oxynitride (MoSiON). Further, a mask having a halftone phase shift film of SiO or SiON is proposed.

Meanwhile, it is also needed to miniaturize mask patterns more than ever before. To enhance resolution, a photomask blank in which a hard mask film is laminated is used for minimizing a thickness of a resist film in the step of patterning of a mask pattern. For example, when a chromium-containing film is used as a light-shielding film, silicon-containing film is formed thereon as a hard mask.

CITATION LIST

Patent Document 1: JP-A H07-140635

SUMMARY OF INVENTION

However, it was found that defects are generated due to deterioration with age when a photomask blank or photomask has a film structure including a chromium-containing film and a silicon-containing film contacted to each other.

An object of the invention is to provide a photomask blank that is restrained a defect generated due to deterioration with age when a photomask blank or photomask has a film structure including a chromium-containing film and a silicon-containing film contacted to each other, and a method for preparing the photomask blank.

In some cases, degrees of defects (ex. number or size of defects) are not same even when the compositions of a chromium-containing film and a silicon-containing film measured by a usual method (ex. EPMA) are common among some samples. The defects in a film structure including a film containing chromium and nitrogen and a film containing silicon and oxygen contacted to each other are generated at the interface of the film containing chromium and nitrogen and the film containing silicon and oxygen. The defects are resulted with volume change caused by oxidation of chromium contained in the film containing chromium and nitrogen with oxygen contained in the film containing silicon and oxygen at the interface or its vicinity of the film containing chromium and nitrogen and the film containing silicon and oxygen. The inventors found that, in a structure of a film (A) containing chromium and nitrogen, and free of silicon, and a film (B) containing silicon and oxygen, and free of a transition metal that are contacted to each other, when an intension of secondary ions is measured along a thickness direction of the films by a time-of-flight secondary ion mass spectrometry (TOF-SIMS), an intension of secondary ions derived from $Cr_2O_5$ is lower than an intension of secondary ions derived from SiN, at a position located at the interface or its vicinity of the film (A) and film (B) and having a maximum intensity of secondary ions derived from $SiCrO_5$, and defects are hard to generate and increase of defects upon deterioration with age is restrained in the structure of the films (A) and (B) satisfied above. The invention is predicated on these findings.

In one aspect, the invention provides a photomask blank including a transparent substrate, at least one film (A) containing chromium and nitrogen, and free of silicon, and at least one film (B) containing silicon and oxygen, and free of a transition metal, the film (A) and film (B) being contacted to each other. When an intension of secondary ions is measured along a thickness direction of the films by a time-of-flight secondary ion mass spectrometry (TOF- SIMS), an intension of secondary ions derived from $Cr_2O_5$ is lower than an intension of secondary ions derived from SiN, at a position located at the interface or its vicinity of the film (A) and film (B) and having a maximum intensity of secondary ions derived from $SiCrO_5$.

In a preferred embodiment, the film (A) contains oxygen.

In a preferred embodiment, the film (A) is composed of a compositionally graded layer having a composition continuously graded in thickness direction, or multiple layers, and a concentration of chromium at the interface of the film (A) and film (B) is lower than a concentration of chromium in the film (A) of remote from the interface. Preferably, an atomic ratio Cr/E of chromium (Cr) to E representing an element other than chromium at the interface of the film (A) and film (B) is up to 4.

In a preferred embodiment, at least one film (A) includes a light-shielding film or the film (B) includes a SiO film.

In a preferred embodiment, the film (B) is composed of a single layer having a uniform composition in thickness direction, a compositionally graded layer having a composition continuously graded in thickness direction, or multiple layers, and a concentration of oxygen at the interface of the film (A) and film (B) is lower than a concentration of oxygen in the film (B) of remote from the interface.

In a preferred embodiment, at least one film (B) includes a hard mask film. Preferably, the film (B) is thinner than the film (A).

In a more preferred embodiment, a film (C) composed of a film containing a transition metal and silicon or a film containing silicon and free of both of a transition metal and oxygen is formed between the transparent substrate and the films (A) and (B).

In another aspect, the invention provides a method for preparing a photomask blank including a transparent substrate, at least one film (A) containing chromium and nitrogen, and free of silicon, and at least one film (B) containing silicon and oxygen, and free of a transition metal, the film (A) and film (B) being contacted to each other, by a sputtering method. The method includes steps of:

i) when the film (B) is deposited on the film (A), in a definite period of time at the initial stage of the deposition, sputtering the film (B) with supplying an oxygen-containing gas in an amount or flow rate reduced from the setting value conforming to the prescribed composition in accordance with function of the film (B) or without supplying an oxygen-containing gas, then, sputtering the film (B) with supplying an oxygen-containing gas in an amount or flow rate of the setting value conforming to the prescribed composition; or ii) when the film (A) is deposited on the film (B), sputtering the film (B) with supplying an oxygen-containing gas in an amount or flow rate of the setting value conforming to the prescribed composition in accordance with function of the film (B), then, in a definite period of time at the final stage of the deposition, sputtering the film (B) with supplying an oxygen-containing gas in an amount or flow rate reduced from the setting value conforming to the prescribed composition or without supplying an oxygen-containing gas.

ADVANTAGEOUS EFFECTS OF INVENTION

A photomask blank and photomask having a structure of a film (A) containing chromium and a film (B) containing silicon that are contacted to each other are provided. The photomask blank and photomask are restrained generation of defects upon deterioration with age.

BRIEF DESCRIPTION OF DRAWINGS

FIG. 2 is a diagram of intensity distribution of secondary ions measured by a time-of-flight secondary ion mass spectrometry (TOF-SIMS) at the interface or its vicinity of the films (A) and (B) in Example 1.

FIG. 3 is a diagram of intensity distribution of secondary ions measured by a time-of-flight secondary ion mass spectrometry (TOF-SIMS) at the interface or its vicinity of the films (A) and (B) in Example 2.

FIG. 4 is a diagram of intensity distribution of secondary ions measured by a time-of-flight secondary ion mass spectrometry (TOF-SIMS) at the interface or its vicinity of the films (A) and (B) in Comparative Example 1.

DESCRIPTION OF PREFERRED EMBODIMENTS

The invention is directed to a photomask mask blank including a transparent substrate which is transparent to exposure light, such as a quartz substrate, and a film (A) containing chromium and nitrogen, and free of silicon, and a film (B) containing silicon and oxygen, and free of a transition metal, as films formed on the transparent substrate, the films being contacted to each other. Further, a film (C) containing a transition metal and silicon, or containing silicon and free of both of transition metal and oxygen may be formed between the films (A) and (B) and the transparent substrate, preferably be formed contiguous to the film (A) or the transparent substrate. The films (A), (B) and (C) are, respectively, constructed by a single layer or multiple layers (at least two layers and typically up to four layers).

Figure 1A:
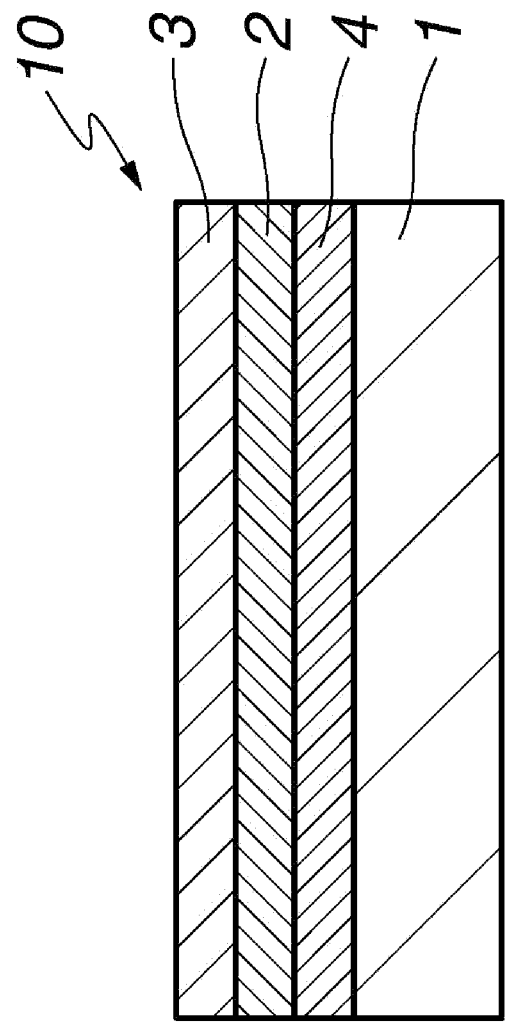
FIG. 1A is a cross-sectional view of one exemplary photomask blank of first embodiment of the invention.

Exemplary photomask blanks are described as follows. A cross-sectional view of one exemplary photomask blank of first embodiment having only one interface of a film (A) and a film (B) is illustrated in FIG. 1A. This photomask blank includes also a film (C). In the photomask blank illustrated in FIG. 1A, the film (C) is formed between the films (A) and (B). The photomask blank 10 has a film-stacked structure of three films which consist of a film (C) 4 containing a transition metal and silicon, or containing silicon and free of both of transition metal and oxygen, formed contiguous to a transparent substrate 1, a film (A) 2 containing chromium and nitrogen, and free of silicon, formed contiguous to the film (C), and a film (B) 3 containing silicon and oxygen, and free of a transition metal, formed contiguous to the film (A).

Figure 1B:
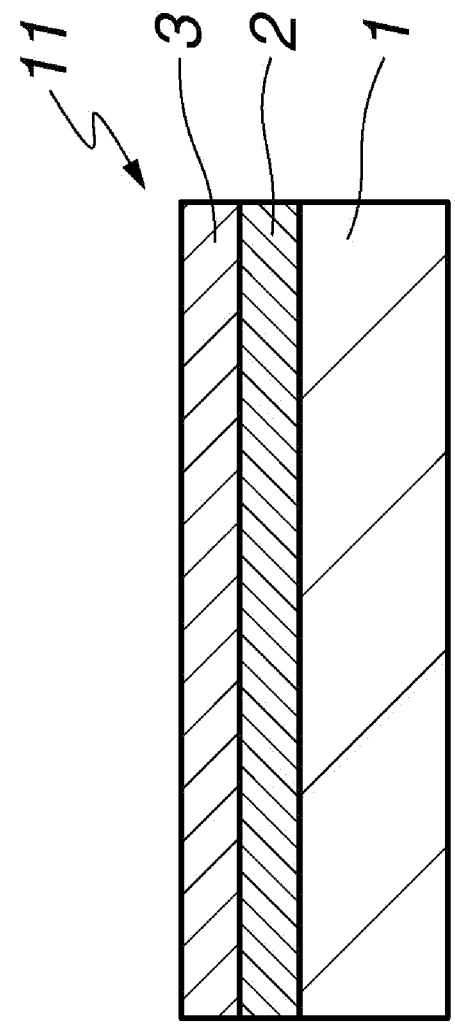
FIG. 1B is a cross-sectional view of another exemplary photomask blank of first embodiment of the invention.

A cross-sectional view of another exemplary photomask blank of first embodiment is illustrated in FIG. 1B. This photomask blank does not include a film (C). In the photomask blank illustrated in FIG. 1B, the film (A) is formed contiguous to a transparent substrate. The photomask blank 11 has a film-stacked structure of two films which consist of a film (A) 2 containing chromium and nitrogen, and free of silicon, formed contiguous to a transparent substrate 1, and a film (B) 3 containing silicon and oxygen, and free of a transition metal, formed contiguous to the film (A).

With respect to the films (A) and (B) of the invention, when an intension of secondary ions is measured along a thickness direction of the films by a time-of-flight secondary ion mass spectrometry (TOF-SIMS), an intension of secondary ions derived from $Cr_2O_5$ is lower than an intension of secondary ions derived from SiN, at a position (depth along the thickness direction) located at the interface or its vicinity of the film (A) and film (B) and having a maximum intensity of secondary ions derived from $SiCrO_5$. According to the films (A) and (B) constituted so as to satisfy such the intension of secondary ions, defects generated at the interface or its vicinity of a film (A) containing chromium and nitrogen, and free of silicon and a film (B) containing silicon and oxygen, and free of a transition metal are decreased or restrained.

When an intension of secondary ions is measured by TOF-SIMS, the ratio $I_A/I_C$ of an intension $I_A$ of secondary ions derived from $Cr_2O_5$ to an intension $I_C$ of secondary ions derived from SiN, at the position having a maximum intensity of secondary ions derived from $SiCrO_5$ is less than 1, preferably up to 0.8. The lower limit of the ratio $I_A/I_C$ is typically at least 0.05.

With respect to stack order of the film (A) and film (B), either of the film (A) and the film (B) may be positioned at the transparent substrate side. A photomask blank of the invention is not limited to a photomask blank including a film-stacked structure consisting of one film (A) and one file (B) or a photomask blank having only one interface of the film (A) and the film (B) and includes a photomask blank having a plurality of interfaces of the film (A) and the film (B). For example, two films (A) may be respectively formed contiguous to both sides of one film (B), two films (B) may be respectively formed contiguous to both sides of one film (A), and a plurality of films (A) and a plurality of films (B) may be stacked alternatively.

In case of the film-stacked structure including two or more of the films (A), function, thickness, construction of layer(s) and composition, of each of the films (A) may be same or different each other. On the other hand, in case of the film-stacked structure including two or more of the films (B), function, thickness, construction of layer(s) and composition, of each of the films (B) may be same or different each other.

In case of the film-stacked structure having a plurality of interfaces of the film (A) and the film (B), at least one interface must satisfy the magnitude relation between the intension $I_A$ of secondary ions derived from $Cr_2O_5$ and the intension $I_C$ of secondary ions derived from SiN, which are measured by TOF-SIMS, at the position having a maximum intensity of secondary ions derived from $SiCrO_5$. However, preferably, all of the interfaces satisfy the magnitude relation.

The invention provides a method for designing, selecting or preparing a photomask blank including a transparent substrate, at least one film (A) containing chromium and nitrogen, and free of silicon, and at least one film (B) containing silicon and oxygen, and free of a transition metal, the film (A) and film (B) being contacted to each other. In each of the methods, the film (A) and the film (B) is prepared so as to satisfy the magnitude relation between the intension $I_A$ of secondary ions derived from $Cr_2O_5$ and the intension $I_C$ of secondary ions derived from SiN, which are measured by TOF-SIMS, at the position having a maximum intensity of secondary ions derived from $SiCrO_5$. The method can provide a photomask blank in which increase of defects upon deterioration with age between the films (A) and (B) is restrained.

The film (A) is a film containing chromium and nitrogen, and free of silicon. The film (A) is preferably composed of a material which is resistant to fluorine base dry etching and susceptible to chlorine base dry etching. Examples of the material for the film (A) include chromium compounds containing chromium, nitrogen, and optionally, either or both of oxygen and carbon, for example, chromium nitride (CrN), chromium oxynitride (CrON), chromium nitride carbide (CrNC) and chromium oxynitride carbide (CrONC). The material containing chromium and nitrogen, and free of silicon may further contains tin (Sn) or indium (In). More preferably, the material containing chromium and nitrogen, and free of silicon contains oxygen along with chromium. The thickness of the film (A) is preferably at least 3 nm, more preferably at least 40 nm, and preferably up to 100 nm, more preferably up to 70 nm.

The film (A) is preferably a light-shielding film. The film (A) may include a light-shielding film as one or more layers of the film (A). When the light-shielding film is formed on a substrate as the film (A) that can be functioned as an etching mask film for a film which is contiguous to the transparent substrate side of the film (A) such as the film (C) or for the transparent substrate, the photomask blank may be a binary photomask blank. A binary photomask is prepared from the photomask blank.

Where the film (A) is a light-shielding film, the chromium compound of the film (A) preferably has a chromium content of at least 30 at %, more preferably at least 35 at %, and less than 100 at %, more preferably up to 99 at %, and most preferably up to 90 at %. The chromium compound preferably has an oxygen content of at least 0 at %, and up to 60 at %, more preferably up to 40 at %. When the oxygen is contained, preferably with a content of at least 1 at %, an etching rate can be adjusted. The chromium compound of the film (A) preferably has a nitrogen content of at least 1 at %, preferably at least 10 at %, and up to 50 at %, more preferably up to 40 at %. The chromium compound preferably has a carbon content of at least 0 at %, and up to 30 at %, more preferably up to 20 at %. When the carbon is contained, preferably with a content of at least 1 at %, an etching rate can be adjusted. The total content of chromium, oxygen, nitrogen and carbon is preferably at least 95 at %, more preferably at least 99 at %, and especially 100 at %. The thickness of a light-shielding film is preferably at least 30 nm, more preferably at least 40 nm, and preferably up to 70 nm, more preferably up to 60 nm. A light-shielding film may be constructed with multilayers of a combination of a light-shielding layer and an antireflective layer.

It is needed for a photomask to have a degree of light-shielding that is enough to shield exposure light substantively at an outer frame pattern or a portion having light-shielding ability in a photomask pattern region. A light-shielding function is ensured with the light-shielding film of the film (A). An optical density of the combination of the films (C) and (A), in case that the film (C) is included in the photomask blank or photomask, or an optical density of the film (A) only, in case that the film (C) is not included in the photomask blank or photomask, is preferably at least 2, more preferably 2.5, most preferably 3 with respect to exposure light, for example, light having a wavelength of up to 250 nm, typically light having a wavelength of up to 200 nm such as ArF excimer laser (193 nm).

The film (B) is a film containing silicon and oxygen, and free of a transition metal. The film (B) contains neither chromium (Cr) which is contained in the film (A) nor other transition metals. The film (B) is preferably composed of a material which is resistant to chlorine base dry etching and susceptible to fluorine base dry etching. Examples of the material for the film (B) include silicon compounds containing silicon, and oxygen or oxygen and nitrogen, for example, silicon oxide (SiO) and silicon oxynitride (SiON), especially, silicon oxide (SiO). The thickness of the film (B) is preferably at least 1 nm, more preferably at least 2 nm, and preferably up to 100 nm, more preferably up to 80 nm.

The film (B) is preferably a hard mask film. The film (B) may include a hard mask film as one or more layers of the film (B). When the hard mask film can be functioned as an etching mask film for a film which is contiguous to the transparent substrate side of the film (B) such as the film (A). Where the film (B) is a hard mask film, a silicon content is preferably at least 20 at %, more preferably at least 33 at %, and preferably up to 95 at %, and more preferably up to 80 at %, an oxygen content is preferably at least 1 at %, more preferably at least 20 at %, and preferably up to 70 at %, more preferably up to 66 at %, and a nitrogen content is preferably up to 50 at %, more preferably up to 40 at %. The total content of silicon, oxygen and nitrogen is preferably at least 95 at %, more preferably at least 99 at %, and especially 100 at %. The thickness of a hard mask is preferably at least 1 nm, more preferably at least 2 nm, and preferably up to 20 nm, more preferably up to 10 nm. When the film (B) is a hard mask film, the film (B) preferably has a thickness less than the film (A). In particular, the difference of the thicknesses between the films (A) and (B) is preferably at least 20 nm, more preferably at least 30 nm, or the thickness of the film (B) corresponds to preferably up to ½, more preferably up to ⅓, of the thickness of the film (A).

The film (B) may also be a phase shift film such as a halftone phase shift film. The film (B) may include a phase shift film as one layer of the film (B). Where the film (B) is a phase shift film, a silicon content is preferably at least 30 at %, more preferably at least 40 at %, and preferably up to 60 at %, and more preferably up to 50 at %, an oxygen content is preferably at least 1 at %, more preferably at least 2 at %, and up to 10 at %, more preferably up to 5 at %, and a nitrogen content is preferably at least 0 at %, more preferably at least 40 at %, and preferably up to 70 at %, more preferably up to 60 at %.

In view of resistance to fluorine dry etching or securement of light-shielding function, the film (A) is preferably composed of a film containing chromium in a high concentration (content). However, such the film containing chromium in a high concentration is easy to be oxidized with oxygen which is contained in the film (B) at the interface or its vicinity of the film (A) and film (B). Thus, the film (A) is preferably composed of a compositionally graded layer having a composition continuously graded in thickness direction, or multiple layers, and a concentration of chromium at the interface of the film (A) and film (B) may be lower than a concentration of chromium in the film (A) remote from the interface. In view of oxidation of chromium with oxygen which is contained in the film (B), an atomic ratio Cr/E of chromium (Cr) to E representing elements other than chromium at the interface of the film (A) and film (B) is preferably up to 4, more preferably up to 2.5. The lower limit of the ratio Cr/E is typically at least 0.5.

On the other hand, the film (B) may be composed of a single layer having a uniform composition in thickness direction. In view of oxidation of chromium with oxygen which is contained in the film (B), the film (B) is preferably composed of a compositionally graded layer having a composition continuously graded in thickness direction, or multiple layers, and a concentration of oxygen at the interface of the film (A) and film (B) may be lower than a concentration of oxygen in the film (B) remote from the interface. In view of oxidation of chromium with oxygen which is contained in the film (B), an atomic ratio O/Si of oxygen (O) to silicon (Si) at the interface of the film (A) and film (B) is preferably up to 2, more preferably up to 1.7. The lower limit of the ratio O/Si is typically at least 0.5, and preferably at least 1.2, more preferably at least 1.3, most preferably at least 1.5.

The film (C) is a film containing a transition metal and silicon or a film containing silicon and free of both of a transition metal and oxygen. The film (C) is preferably composed of a material which is resistant to chlorine base dry etching and susceptible to fluorine base dry etching. Examples of the material containing a transition metal and silicon for the film (C) include transition metal silicon (MeSi), transition metal silicon compounds containing transition metal (Me), silicon and at least one element selected from the group consisting of oxygen, nitrogen and carbon, for example, transition metal silicon oxide (MeSiO), transition metal silicon nitride (MeSiN), transition metal silicon carbide (MeSiC), transition metal silicon oxynitride (MeSiON), transition metal silicon oxycarbide (MeSiOC), transition metal silicon nitride carbide (MeSiNC), and transition metal silicon oxide nitride carbide (MeSiONC). The transition metal (Me) is preferably at least one metal selected from the group consisting of titanium (Ti), vanadium (V), cobalt (Co), nickel (Ni), zirconium (Zr), niobium (Nb), molybdenum (Mo), hafnium (Hf), tantalum (Ta) and tungsten (W). Inter alia, molybdenum (Mo) is preferred from the standpoint of dry etching process ability.

On the other hand, examples of the material containing silicon and free of both of a transition metal and oxygen for the film (C) include silicon alone and a material containing silicon and nitrogen, and free of both of a transition metal and oxygen, for example, silicon nitride (SiN) and silicon nitride carbide (SiNC). Typically, the material for the film (C) contains nitrogen. In this case, a silicon content is preferably at least 30 at %, more preferably at least 40 at %, and preferably up to 99 at %, and more preferably up to 70 at %, and a nitrogen content is preferably at least 1 at %, more preferably at least 10 at %, and preferably up to 70 at %, more preferably up to 60 at %. The material for the film (C) is preferably free of chromium (Cr). The thickness of the film (C) is preferably at least 1 nm, more preferably at least 2 nm, and preferably up to 100 nm, more preferably up to 80 nm.

The film (C) may be a phase shift film such as a halftone phase shift film. Where the film (C) is a phase shift film containing a transition metal and silicon, a transition metal (Me) content is preferably at least 0.1 at %, more preferably at least 1 at %, and preferably up to 30 at %, more preferably up to 20 at %, a silicon content is preferably at least 30 at %, more preferably at least 35 at %, and preferably up to 60 at %, and more preferably up to 50 at %, an oxygen content is preferably at least 1 at %, more preferably at least 2 at %, and preferably up to 15 at %, more preferably up to 10 at %, a nitrogen content is preferably at least 20 at %, more preferably at least 30 at %, and preferably up to 60 at %, more preferably up to 50 at %, and a carbon content is preferably at least 0 at %, more preferably at least 1 at %, and preferably up to 5 at %, preferably up to 3 at %.

On the other hand, where the film (B) is a phase shift film containing silicon and free of both of a transition metal and oxygen, a silicon content is preferably at least 30 at %, more preferably at least 40 at %, and preferably up to 60 at %, and more preferably up to 50 at %, and a nitrogen content is preferably at least 0 at %, more preferably at least 40 at %, and preferably up to 70 at %, more preferably up to 60 at %.

When a phase shift film such as a halftone phase shift film is formed as the film (B) or film (C), the photomask blank may be a phase shift type photomask blank such as a halftone phase shift type photomask blank. A phase shift type photomask such as a halftone phase shift type photomask is prepared from the photomask blank.

A phase shift of the halftone phase shift film with respect to exposure light, i.e., a phase shift between the exposure light transmitted through a phase shift film and the exposure light transmitted through an air layer having the same thickness of the phase shift film may be adjusted to an amount that is enough to increase contrast by interference of exposure lights which are transmitted through both regions, at a border between the region existing the phase shift film (phase shift region) and the region not existing the phase shift film. Specifically, the phase shift is in a range of from 150° to 200°. Although ordinary halftone phase shift films are set to a phase shift of approximately 180°, it is possible from the standpoint of contrast enhancement to adjust the phase shift below or beyond 180° rather than limiting to approximately 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, especially approximately 180°. The halftone phase shift film has a transmittance of exposure light which is preferably at least 3%, more preferably at least 5%, and preferably up to 30%.

The thickness of the halftone phase shift film is preferably up to 80 nm, more preferably up to 70 nm, most preferably up to 65 nm, because a thinner film facilitates to form a finer pattern. The lower limit of the thickness of the halftone phase shift film may be adjusted in a range that is enough to obtain necessary optical properties with respect to exposure light, for example, light having a wavelength of up to 200 nm such as ArF excimer laser light (193 nm). Typically, the lower limit is at least 40 nm.

The films used in the photomask blank of the invention may be formed by a sputtering method. Either DC sputtering or RF sputtering may be employed, and other known methods may also be employed.

When a film containing oxygen, nitrogen or carbon is deposited, preferably, a reactive sputtering is employed as the sputtering. An inert gas and a reactive gas is used as a sputtering gas. Examples of the sputtering gas include a combination of inert gases (rare gases) such as helium gas (He), neon gas (Ne) and argon gas (Ar), and a reactive gas selected from the group consisting of an oxygen-containing gas, a nitrogen-containing gas and a carbon-containing gas, such as oxygen gas ($O_2$), nitrogen oxide gases ($N_2O$ and $NO_2$ gases), nitrogen gas ($N_2$ gas) and carbon oxide gases (CO and $CO_2$ gases). The gases are adjusted so as to obtain an objective composition. In case of a film constructed by multilayers, for example, a film having a composition varied stepwise or continuously in thickness direction, the film may be deposited while compositions of sputtering gases are varied stepwise or continuously for forming such film.

The sputtering pressure is adjusted in consideration of film stress, chemical resistance, cleaning resistance, etc. Typically, for enhancing chemical resistance, the pressure is adjusted to preferably at least 0.01 Pa, more preferably at least 0.03 Pa, and preferably up to 1 Pa, more preferably up to 0.3 Pa. Flow rate of each gas is adjusted so as to obtain the desired composition. Typically, the flow rate is in a range of 0.1 to 100 sccm. When a reactive gas is used with an inert gas, a ratio of a flow rate of the reactive gas to a flow rate of the inert gas is preferably up to 5.0.

A chromium target or a target containing chromium added with at least one element selected from the group consisting of oxygen, nitrogen and carbon may be used for forming the film (A), as a sputter target. A silicon target, a silicon nitride target, or a target containing both of silicon and silicon nitride may be used for forming the film (B) or (C), as a sputter target. A transition metal target, or a complex target of silicon and transition metal may be further used for forming the film (C), as a sputter target. A power applied across the target is adjusted in consideration of target size, cooling efficiency, controllability of deposition, etc. Typically, the power is 0.1 to 10 W/cm$^2$ with respect to unit sputtering area of the sputtering target.

When an intension of secondary ions is measured along a thickness direction of the films by a time-of-flight secondary ion mass spectrometry (TOF-SIMS), the inventive photomask blank has an intension of secondary ions derived from $Cr_2O_5$ being lower than an intension of secondary ions derived from SiN, at a position located at the interface or its vicinity of the film (A) and film (B) and having a maximum intensity of secondary ions derived from $SiCrO_5$. The photomask blank can be prepared by, for example, depositing a film (B) by sputtering with using an oxygen-containing gas such as oxygen gas ($O_2$), nitrogen oxide gases ($N_2O$ and $NO_2$ gases) and carbon oxide gases (CO and $CO_2$ gases). Preferably, the deposition of the film (B) should be include the steps of:

i) when the film (B) is deposited on the film (A), in a definite period of time at the initial stage of the deposition, sputtering the film (B) with supplying an oxygen-containing gas in an amount or flow rate reduced from the setting value conforming to the prescribed composition in accordance with function of the film (B) or without supplying an oxygen-containing gas, then, sputtering the film (B) with supplying an oxygen-containing gas in an amount or flow rate of the setting value conforming to the prescribed composition; or ii) when the film (A) is deposited on the film (B), sputtering the film (B) with supplying an oxygen-containing gas in an amount or flow rate of the setting value conforming to the prescribed composition in accordance with function of the film (B), then, in a definite period of time at the final stage of the deposition, sputtering the film (B) with supplying an oxygen-containing gas in an amount or flow rate reduced from the setting value conforming to the prescribed composition or without supplying an oxygen-containing gas.

The definite period of time at the initial stage or the final stage for supplying an oxygen-containing gas at reduced flow rate or not supplying an oxygen-containing gas is preferably adjusted such that the thickness formed at the reduced or zero flow rate corresponds to at least 1/100, preferably at least 1/50, and up to 1/4, preferably up to 1/5 of whole thickness of the film (B). Particularly, when the definite period of time at the initial stage or the final stage for supplying an oxygen-containing gas at reduced flow rate or not supplying an oxygen-containing gas is adjusted such that the thickness formed at the reduced or zero flow rate is preferably up to 3 nm, more preferably up to 2 nm, most preferably up to 1 nm, only the interface portion is adjusted, and generation of defects is reduced without changing the properties of substantively whole of the film (B).

In the photomask blank which is prepared by the above-mentioned method, it is presumed that the oxygen content in extremely small region at the interface portion of the film (B) being contacted with the film (A) (hereafter, interface region) is lower than the oxygen content the portion of the film (B) other than the interface region, i.e., a side remote from the interface region. The interface region derived from deference between the oxygen content of the interface region and the oxygen content of the portion of the film (B)

other than the interface region is effective, even if the interface region is too small and hard to be identified by ESCA which is a common method for compositional analysis of the film along a depth direction.

The photomask blank of the invention is processed into a photomask. The photomask blank may be processed into a photomask by a standard technique. For example, first, the photomask blank of the invention is prepared, and the films (A) and (B) or the films (A), (B) and (C) are patterned, forming one or more photomask patterns of the film(s) selected from the group consisting of the films (A) and (B) or the films (A), (B) and (C). An organic resist film of such as a chemically amplified resist material (typically, exposed to imagewise by electron beam) is used for the patterning. In the pattering, the resist film is patterned into a resist pattern, the films on the transparent substrate, or the films on the transparent substrate and the transparent substrate are patterned in sequence with using the resist pattern, or the mask pattern(s) formed in the process for preparing the photomask from the film(s) included in the photomask blank, as an etching mask, by chlorine base dry etching or fluorine base dry etching selected in accordance with the property of the intended film or the transparent substrate. The thickness of the resist film is preferably at least 50 nm, more preferably at least 70 nm, and preferably up to 200 nm, more preferably up to 150 nm.

For example, in case of a photomask blank (in FIG. 1A) having films constructed with three layers consisting of a film (C) (ex. a halftone phase shift film), a film (A) (ex. a light-shielding film) and a film (B) (ex. a hard mask film) which are stacked in the order on a transparent substrate, the photomask blank may be processed into a photomask by the following procedures. First, a resist film is formed on the film (B) and exposed to imagewise, for example, by electron beam, resulting a resist pattern. Subsequently, a mask pattern of the film (B) is formed with utilizing the resulting resist pattern as an etching mask by fluorine base dry etching. Next, a mask pattern of the film (A) is formed with utilizing the mask pattern of the film (B) as an etching mask by chlorine base dry etching. Next, a mask pattern of the film (C) is formed with utilizing the mask pattern of the film (A) as an etching mask and the mask pattern of the film (B) is removed, by fluorine base dry etching, yielding a photomask (a phase shift type photomask such as a halftone phase shift type photomask).

In a photolithographic method for forming a pattern with a half pitch of up to 50 nm, typically up to 30 nm, and more typically up to 20 nm, most typically up to 10 nm on a processable substrate, including the steps of forming a photoresist film on the processable substrate and exposing the photoresist film to light of wavelength up to 250 nm, especially up to 200 nm, typically ArF excimer laser (wavelength 193 nm) or $F_2$ laser (wavelength 157 nm), through a patterned mask for transferring the pattern to the photoresist film, the photomask of the invention is best suited for use in the exposure step.

The photomask obtained from the photomask blank is applicable to the pattern forming process including projecting light to the photomask pattern for transferring the photomask pattern to an object (photoresist film) on the processable substrate. The irradiation of exposure light may be either dry exposure or immersion exposure. The photomask of the invention is effective particularly when a wafer of at least 300 mm as the processable substrate is exposed to a photomask pattern of light by the immersion lithography.

EXAMPLE

Examples are given below for further illustrating the invention although the invention is not limited thereto.

Example 1

A phase shift film of MoSiON (75 nm thick) was formed on a quartz substrate of 154 mm square×about 6.35 mm thick by a sputtering method. Oxygen, nitrogen and argon gases were used as sputtering gas. Two kinds of $MoSi_2$ target and Si target were used as targets. While the substrate was rotated on its axis of rotation at 30 rpm, the film was deposited. The composition of the film was analyzed by EPMA utilizing XPS (x-ray photoelectron spectroscopy) system (Thermo Fisher Scientific Inc., K-Alpha), and was Mo:Si:O:N=1:4:1:4 (atomic ratio).

Next, as the film (A), a light-shielding film consisting of two layers of a CrN layer (30 nm thick) and a CrON layer (20 nm thick) disposed in the order from substrate side was formed on the phase shift film by a sputtering method. Nitrogen and argon gases (CrN layer) and oxygen, nitrogen and argon gases (CrON layer) were used as sputtering gases, respectively. Chromium metal target was used as a target. While the substrate was rotated on its axis of rotation at 30 rpm, the film was deposited. The composition of the film was analyzed by EPMA, and was Cr:N=9:1 (atomic ratio) in the CrN layer and Cr:O:N=4:5:1 (atomic ratio) in the CrON layer, respectively.

Next, as the film (B), a hard mask film of single layer (5 nm thick) composed of SiO was formed on the film (A) by a sputtering method. Oxygen and argon gases were used as sputtering gases. While ½₀ of the whole time for depositing of the hard mask from the start of the spattering, oxygen gas was fed at 20 sccm, thereafter, oxygen gas was increased to 40 sccm. Argon gas was constantly fed at 15 sccm. Si target was used as a target with a power of 1.000 W which was applied across the target. While the substrate was rotated on its axis of rotation at 30 rpm, the film was deposited. The composition of the film was analyzed by EPMA, and was Si:O=1:2 (atomic ratio) in the whole of the film.

An intension of emitted secondary ions of the obtained photomask blank was measured along a thickness direction of the films by a time-of-flight secondary ion mass spectrometry (TOF-SIMS) apparatus (ION-TOF GmbH). A sputter ion gun for surface etching and ion gun for excited ion were used. Intensity distributions of several kinds of emitted secondary ions were measured at a position located at the interface or its vicinity of the film (A) and film (B) with detecting the several kinds of secondary ions emitted at the position located at the interface or its vicinity of the film (A) and film (B) by a detector, while repeating, alternately, the etching by Cs ions as sputter ions and the measurement of the secondary ions emitted by irradiation of $Bi_3^{++}$ ions (primary accelerated voltage: 25 kV, primary current: 0.2 pA) as primary ions (excited ions). The results are shown in FIG. 2. The results show that the intension of secondary ions derived from $Cr_2O_5$ is lower than the intension of secondary ions derived from SiN, at a position (depth) having a maximum intensity of secondary ions derived from $SiCrO_5$.

Next, defect inspection was carried out to a plurality of photomask blanks obtained by the above-mentioned procedures. Maskblanks Inspection System M6640S (Lasertec Corporation) was used for the defect inspection. At right after the preparation of the photomask blank, total number of defects detected in 146 mm square of the center area the photomask blank was up to 20 in each photomask blank with respect to detection lower size limit of about 0.06 μm. After holding the plurality of photomask blanks that were inspected defects in fourteen days under clean environment at room temperature, defect inspection was carried out to the plurality of photomask blanks by the same manner. Total number of defects was up to 20 in each photomask blank.

Example 2

A phase shift film and film (A) was formed on a quartz substrate by the same manner as shown in Example 1. Next, as the film (B), a hard mask film of single layer (5 nm thick) composed of SiO was formed on the film (A) by a sputtering method. Oxygen and argon gases were used as sputtering gas. Si target was used as a target. While the substrate was rotated on its axis of rotation at 30 rpm, the film was deposited. A flow rate of argon and a power applied across the target were set as same as Example 1. In this case, while 1/20 of the whole time for depositing of the hard mask from the start of the spattering, oxygen gas was same, thereafter, oxygen gas was set to lower flow rate of 20 sccm. The composition of the film was analyzed by EPMA, and was Si:O=1:1.2 (atomic ratio) in the whole of the film.

Intension distributions of several kinds of emitted secondary ions were measured at a position located at the interface or its vicinity of the film (A) and film (B) by the same manner as shown in Example 1. The results are shown in FIG. 3. The results show that the intension of secondary ions derived from $Cr_2O_5$ is lower than the intension of secondary ions derived from SiN, at a position (depth) having a maximum intensity of secondary ions derived from $SiCrO_5$.

Next, defect inspection was carried out by the same manner as shown in Example 1 to a plurality of photomask blanks obtained by the above-mentioned procedures. Both of at right after the preparation and after holding, defect inspections were carried out to the plurality of photomask blanks. Total number of defects was up to 20 in each photomask blank, in respective inspection.

Comparative Example 1

A phase shift film and film (A) was formed on a quartz substrate by the same manner as shown in Example 1. Next, as the film (B), a hard mask film of single layer (5 nm thick) composed of SiO was formed on the film (A) by a sputtering method. Oxygen and argon gases were used as sputtering gases. Si target was used as a target. While the substrate was rotated on its axis of rotation at 30 rpm, the film was deposited. A flow rate of argon and a power applied across the target were set as same as Example 1. In this case, from the start of the spattering, oxygen gas was constantly set at 50 sccm which is different from Example 1. The composition of the film was analyzed by EPMA, and was Si:O=1:2 (atomic ratio) in the whole of the film.

Intension distributions of several kinds of emitted secondary ions were measured at a position located at the interface or its vicinity of the film (A) and film (B) by the same manner as shown in Example 1. The results are shown in FIG. 4. The results show that the intension of secondary ions derived from $Cr_2O_5$ is higher than the intension of secondary ions derived from SiN, at a position (depth) having a maximum intensity of secondary ions derived from $SiCrO_5$.

Next, defect inspection was carried out by the same manner as shown in Example 1 to a plurality of photomask blanks obtained by the above-mentioned procedures. At right after the preparation of the photomask blank, total number of defects was up to 20 in each photomask blank. However, after holding, total number of defects was increased to at least 200 in each photomask blank. Particularly, many minimal defects were detected on the periphery of the photomask blank.

Japanese Patent Application No. 2016-250722 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a transparent substrate, at least one film (A) containing chromium and nitrogen, and free of silicon, and at least one film (B) containing silicon and oxygen, and free of a transition metal, the film (A) and film (B) being contacted to each other, wherein
when an intension of secondary ions is measured along a thickness direction of the films by a time-of-flight secondary ion mass spectrometry (TOF-SIMS), an intension of secondary ions derived from $Cr_2O_5$ is lower than an intension of secondary ions derived from SiN, at a position located at the interface or its vicinity of the film (A) and film (B) and having a maximum intensity of secondary ions derived from $SiCrO_5$.

2. The photomask blank of claim 1 wherein the film (A) contains oxygen.

3. The photomask blank of claim 1 wherein the film (A) is composed of a compositionally graded layer having a composition continuously graded in thickness direction, or multiple layers, and a concentration of chromium at the interface of the film (A) and film (B) is lower than a concentration of chromium in the film (A) of remote from the interface.

4. The photomask blank of claim 3 wherein an atomic ratio Cr/E of chromium (Cr) to E representing an element other than chromium at the interface of the film (A) and film (B) is up to 4.

5. The photomask blank of claim 1 wherein said at least one film (A) comprises a light-shielding film.

6. The photomask blank of claim 1 wherein the film (B) comprises a SiO film.

7. The photomask blank of claim 1 wherein the film (B) is composed of a single layer having a uniform composition in thickness direction, a compositionally graded layer having a composition continuously graded in thickness direction, or multiple layers, and a concentration of oxygen at the interface of the film (A) and film (B) is lower than a concentration of oxygen in the film (B) of remote from the interface.

8. The photomask blank of claim 1 wherein said at least one film (B) comprises a hard mask film.

9. The photomask blank of claim 8 wherein the film (B) is thinner than the film (A).

10. The photomask blank of claim 1 wherein a film (C) composed of a film containing a transition metal and silicon or a film containing silicon and free of both of a transition metal and oxygen is formed between the transparent substrate and the films (A) and (B).

* * * * *